(12) United States Patent
Huang et al.

(10) Patent No.: US 9,252,236 B2
(45) Date of Patent: Feb. 2, 2016

(54) COUNTER POCKET IMPLANT TO IMPROVE ANALOG GAIN

(71) Applicant: Taiwan Semiconductor Manufacturing Co., Ltd., Hsin-Chu (TW)

(72) Inventors: Shih-Syuan Huang, Taichung (TW); Tsung-Hsing Yu, Taipei (TW); Yi-Ming Sheu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/222,759

(22) Filed: Mar. 24, 2014

(65) Prior Publication Data

US 2015/0243759 A1 Aug. 27, 2015

Related U.S. Application Data

(60) Provisional application No. 61/944,310, filed on Feb. 25, 2014.

(51) Int. Cl.
*H01L 21/265* (2006.01)
*H01L 29/66* (2006.01)
*H01L 29/10* (2006.01)

(52) U.S. Cl.
CPC .... *H01L 29/66492* (2013.01); *H01L 21/26586* (2013.01); *H01L 29/1041* (2013.01)

(58) Field of Classification Search
CPC ....... H01L 21/38; H01L 21/42; H01L 21/425; H01L 21/426; H01L 21/8232
See application file for complete search history.

(56) References Cited

U.S. PATENT DOCUMENTS 8,298,895 B1\* 10/2012 Alptekin .................. 438/276
2013/0256796 A1\* 10/2013 Sathaiya et al. ............. 257/344

\* cited by examiner

*Primary Examiner* — Cheung Lee
(74) *Attorney, Agent, or Firm* — Eschweiler & Associates, LLC

(57) ABSTRACT

A method for improving analog gain in long channel devices associated with a semiconductor workpiece is provided. A gate oxide layer is formed on the semiconductor workpiece, and a plurality of gate structures are formed over the gate oxide layer, wherein a first pair of the plurality of gate structures define a short channel device region and a second pair of the plurality of gate structures define a long channel device region. A first ion implantation with a first dopant is performed at a first angle, wherein the first dopant is one of an n-type dopant and a p-type dopant. A second ion implantation with a second dopant is performed at a second angle, wherein the second angle is greater than the first angle. The second dopant is one or an n-type dopant and a p-type dopant that is opposite of the first dopant, and a height of the plurality of gate structures and the second angle generally prevents the second ion implantation from implanting ions into the short channel device region.

20 Claims, 6 Drawing Sheets

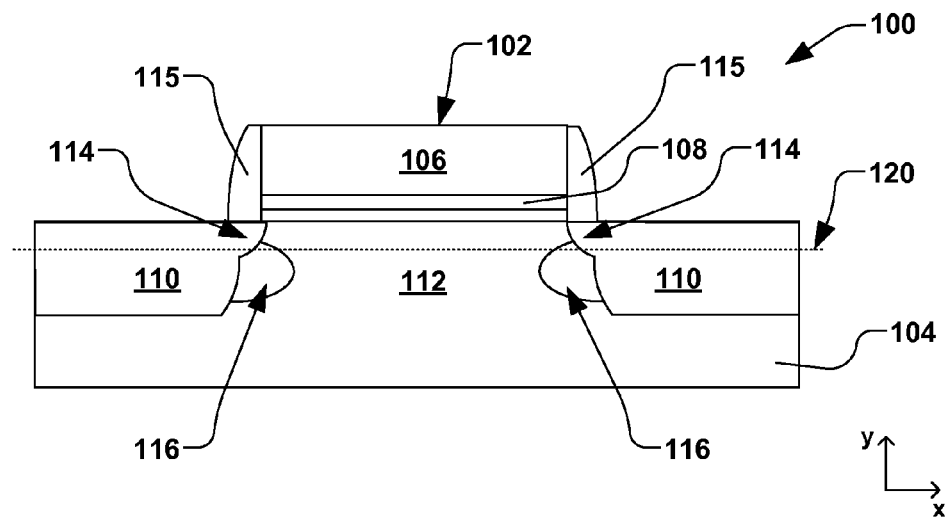
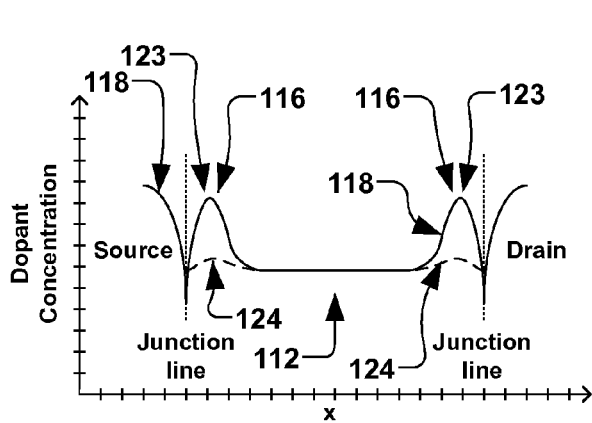 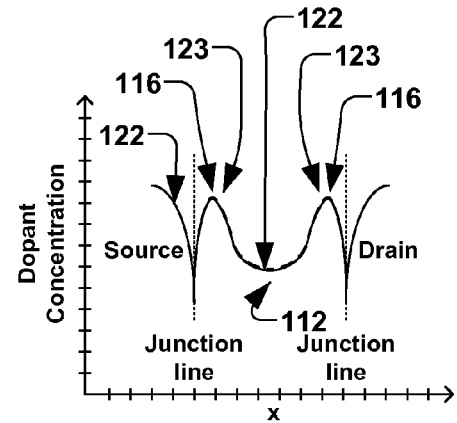
Fig. 2  Fig. 3

US 9,252,236 B2

COUNTER POCKET IMPLANT TO IMPROVE ANALOG GAIN

PRIORITY CLAIM AND CROSS-REFERENCE

This application claims the benefit of U.S. Provisional Application No. 61/944,310, filed Feb. 25, 2014.

FIELD

The present disclosure relates to integrated circuits having short channel and long channel CMOS devices and methods of their fabrication.

BACKGROUND

In semiconductor manufacturing, a semiconductor workpiece or wafer often undergoes many processing steps or stages before a completed die is formed. For example, ion implantation processes are performed on the semiconductor wafer in order to provide a specific doping of the semiconductor workpiece in specific regions, such as seen in source and drain regions of CMOS devices. As integrated circuit devices are scaled down, designers face a tradeoff between short channel effects, drain induced barrier lowering, and output conductance when implementing both short channel and long channel CMOS devices on the wafer. Greater source/drain pocket (PKT) doping to suppress short channel effects in short channel devices typically worsens drain induced barrier lowering and deleteriously increases output conductance in long channel devices, such as analog devices.

BRIEF DESCRIPTION OF THE DRAWINGS

FIG. 1 cross-sectional view of a CMOS device.

FIG. 2 illustrates a doping profile across a cross-section of a long-channel CMOS device.

FIG. 3 illustrates a doping profile across a cross-section of a short-channel CMOS device.

DETAILED DESCRIPTION

Figure 4:
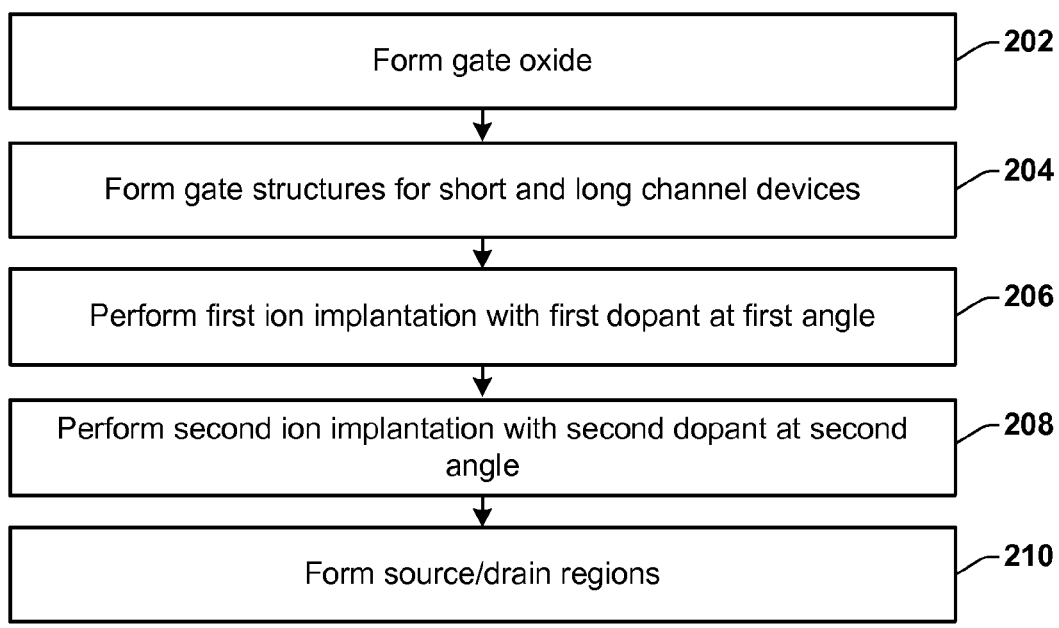
FIG. 4 illustrates an exemplary methodology for improving output conductance in long channel devices.

The present disclosure provides a method for compensating for high dosage pocket implants in long channel CMOS devices. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Referring now to the Figures, FIG. 1 illustrates an exemplary complimentary metal oxide semiconductor (CMOS) device 100 having a gate stack 102 formed over a semiconductor body 104. The CMOS device 100, for example, can comprise an n-channel metal oxide semiconductor (NMOS) transistor or a p-channel metal oxide semiconductor transistor (PMOS) transistor. The semiconductor body 104, for example, may comprise crystalline silicon, doped or undoped silicon, or a semiconductor-on-insulator (SOI) structure. Generally, an SOI structure comprises a layer of a semiconductor material, such as silicon in crystalline form, over an insulating layer. The insulating layer may be, for example, a buried oxide (BOX) layer or a silicon oxide layer. The insulating layer is provided on a substrate, typically a silicon or glass substrate. Other semiconductor bodies, such as a multilayered substrate or gradient substrate may also be used. The crystalline portion of the semiconductor may alternatively be Ge, a SiGe, a group III-V material, or the like.

The gate stack 102, for example, comprises a gate electrode 106 formed over a gate oxide layer 108, wherein a pair of source/drain regions 110 are formed on laterally opposite sides of the gate electrode over a conductivity region 112. For NMOS devices, the CMOS device 100 is formed on conductivity region 112 of a p-type of semiconductor body 104, wherein the source/drain regions 110 are of an n-type material. For PMOS devices, the CMOS device 100 is formed on a conductivity region 112 of an n-type of semiconductor body 104, wherein the source/drain regions 110 are of a p-type material. A pair source/drain extensions 114 are further located beneath a pair of sidewall spacers 115.

In general, the CMOS device 100 can comprise a long channel device or a short channel device (e.g., long channel or short channel transistors). Often, long channel devices and short channel devices are formed on the same semiconductor body 104, wherein bulk ion implantations are commonly performed across the entire semiconductor body. However, thin gate oxide layers 108, as well as highly doped source/drain regions 110, for example, have a tendency to lead to short channel effects in some CMOS devices 100. For example, in order to attain better control in short channel transistors (e.g., to decrease short channel effects), additional ion implantations such as pocket implants or so-called "halo" implants are performed across the semiconductor body during fabrication of the CMOS device 100 to in order to achieve higher doping in a pocket implant region 116. Such pocket implants in short channel devices advantageously lowers drain induced barrier lowering (DIBL) in the short channel devices.

However, when both short channel transistors and long channel devices are present on the same semiconductor body 104, such pocket implants that are performed to reduce short channel effects in short channel devices can deleteriously increase drain induced barrier lowering (DIBL) and output conductance (Gds) in long channel devices. Output conductance is inversely proportional to analog gain in long channel devices. As such, it is desirable for output conductance to be as low as possible in long channel devices.

FIG. 2, for example, illustrates an exemplary long channel doping concentration profile 118 across cross-section 120 of FIG. 1 when the exemplary CMOS device 100 comprises a long channel device. Likewise, FIG. 3 illustrates an exemplary short channel doping concentration profile 122 across the cross-section 120 of FIG. 1 when the exemplary CMOS device 100 comprises a short channel device. As can be seen in FIGS. 2 and 3, dopant concentration peaks 123 near the pocket implant region 116 are associated with the source/drain regions 110 of FIG. 1.

As stated above, in short channel devices, such a high dopant concentration (e.g., as illustrated in the dopant concentration peaks 123 of the short channel doping concentration profile 122 of FIG. 3) is desirable. However, in long channel devices, the high dopant concentration associated with the pocket implant region 116 illustrated in the long channel doping concentration profile 118 of FIG. 2 (e.g., the dopant concentration peaks 123) can deleteriously affects DIBL and Gds. Preferably, the dopant concentration would be linear across the conductivity region 112 of FIG. 1 for long channel devices in order to improve DIBL and Gds. Thus, as illustrated in FIG. 2, the present invention advantageously lowers the dopant concentration peaks 123 in the long channel doping concentration profile 118 and provides a flattened doping profile 124 (shown in dashed lines) across the conductivity region 112 of FIG. 1 for long channel devices, while maintaining the dopant concentration peaks 123 for short channel devices near the pocket implant region 116 in the short channel doping concentration profile 122, as illustrated in FIG. 3.

Accordingly, FIG. 4 is a flow diagram of an exemplary method 200 for forming a semiconductor device wherein the flattened doping profile 124 of FIG. 2 is achieved for long channel devices, while maintaining the high dopant concentration of FIG. 3 in the pocket implant region 116 for short channel devices. Further, various acts of the method 200 of FIG. 4 are illustrated in FIGS. 5A-5F at various stages of fabrication, as will be appreciated hereafter.

It is noted that although methods included in this disclosure may be illustrated and described as a series of acts or events, it will be appreciated that the illustrated ordering of such acts or events are not to be interpreted in a limiting sense. For example, although the illustrated acts or events may occur one after another in time according to the acts or events illustrated in the figures in some instances, in other instances some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5A:
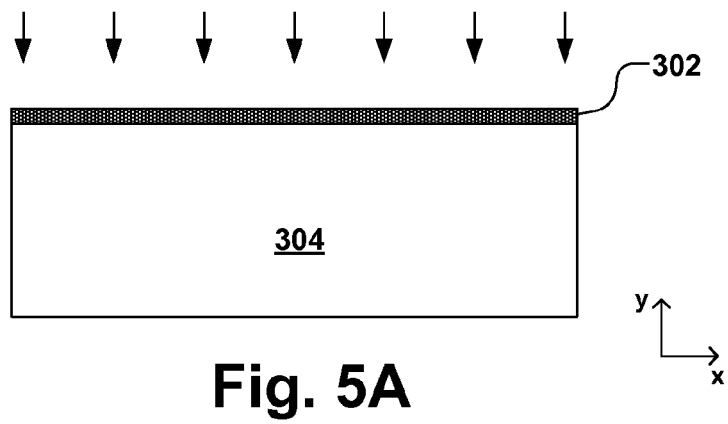
FIGS. 5A-5F illustrate various processing to form semiconductor devices according to the present disclosure.
Figure 5B:
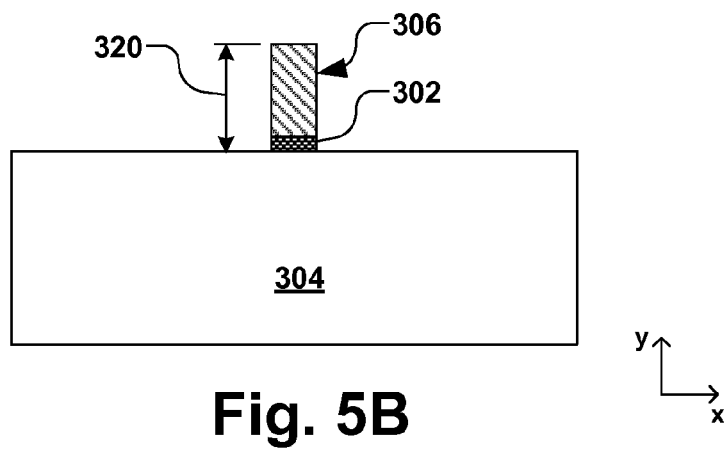
Figure 6A:
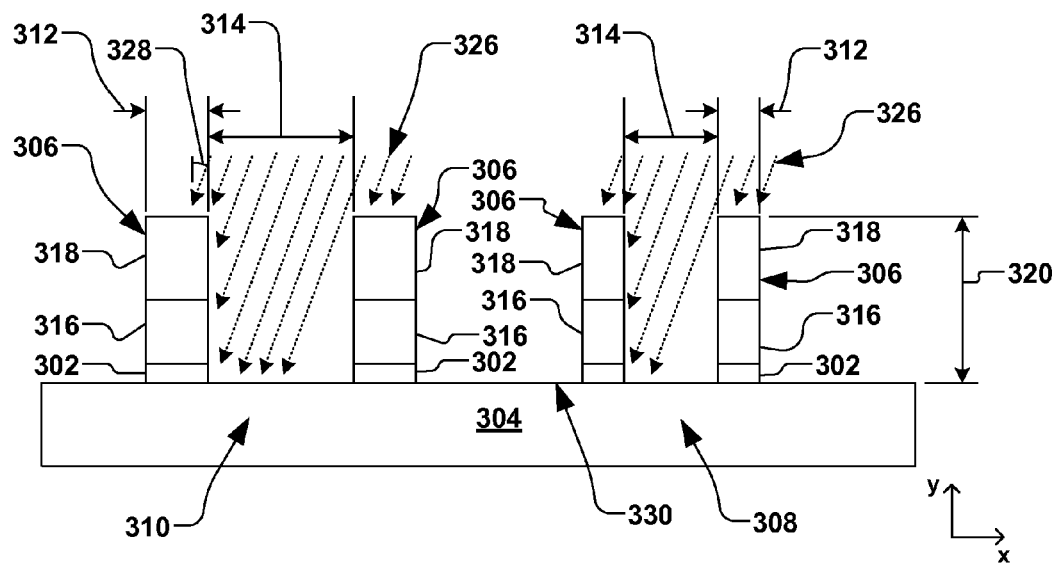
FIGS. 6A-6B illustrate a pocket/halo ion implantation in accordance with an example of the disclosure.
Figure 7A:
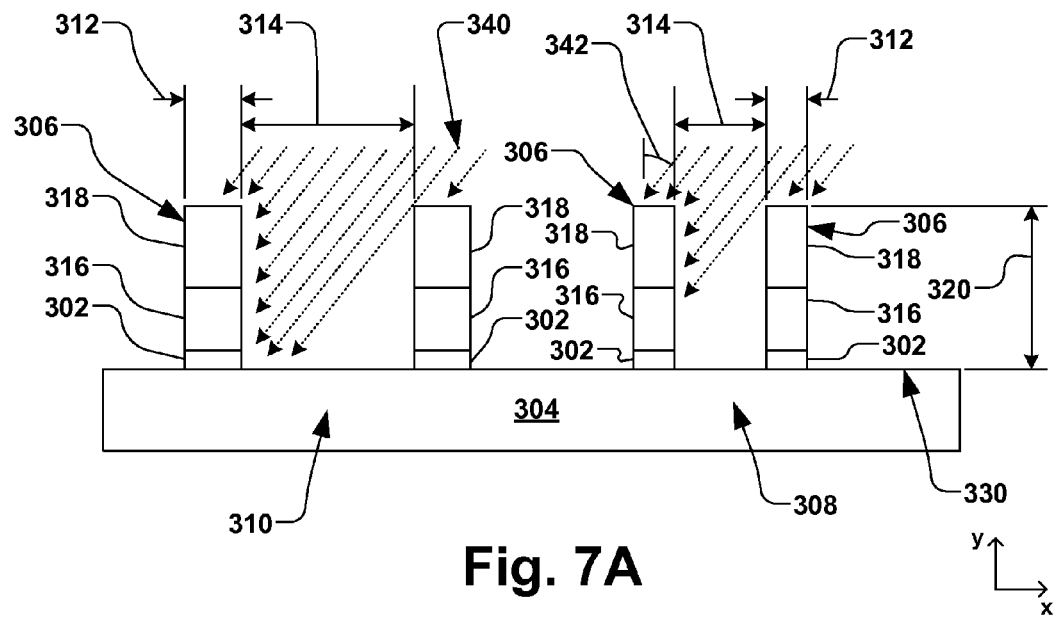
FIGS. 7A-7B illustrate a counter-pocket/halo ion implantation in accordance with an example of the disclosure.

As illustrated in FIG. 4, the method 200 comprises forming a gate oxide layer on a semiconductor body or workpiece in act 202. For example, as illustrated in FIG. 5A, a gate oxide layer 302 is formed or otherwise deposited over a semiconductor body 304. A plurality of gate structures 306 illustrated in FIG. 5B are formed over the gate oxide layer 302 in act 204 of FIG. 4. The formation of the plurality of gate structures in act 204 further generally defines a short channel device region 308 and a long channel device region 310, as illustrated in the example of FIGS. 6A and 7A. It is to be understood that a gate length 312 and poly spacing 314 associated with the gate structures 306 in the short channel device region 308 are respectively shorter than the gate length and poly spacing of the gate structures in the long channel device region 310, as illustrated in the examples of FIGS. 6A and 7A.

It will be understood that forming the plurality of gate structures 306 comprises forming a polysilicon layer 316 over the gate oxide layer 302 and patterning a photoresist layer 318 over the polysilicon layer, as illustrated in FIGS. 6A in 7A. Again, as will be understood by one skilled in the art, once patterned, the photoresist layer 318 covers portions of the polysilicon layer 316, wherein portions of the polysilicon layer and gate oxide layer 302 that were not covered by the photoresist are removed (e.g., by etching), therein defining the plurality of gate structures 306 of FIG. 5B, 6A, and 7B. A height 320 of the plurality of gate structures 306 illustrated in FIG. 5B, 6A, and 7B, for example, can be controlled by controlling a thickness of photoresist layer 318 of FIGS. 6A and 7A.

Figure 5C:
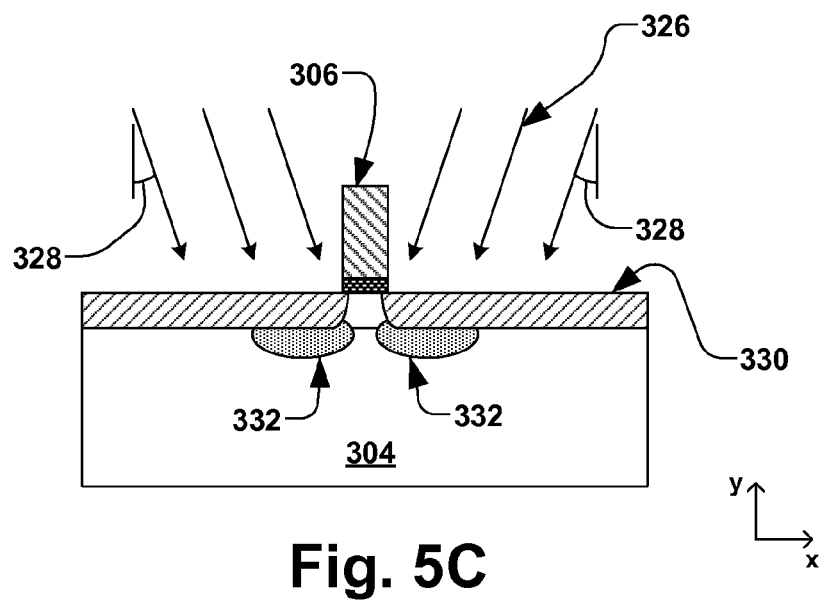

In act 206 of FIG. 4, a first ion implantation is further performed with a first dopant at a first angle. For example, the first ion implantation performed in act 206 comprises a pocket/halo implantation (also called a "PKT" implantation) and/or a lightly doped drain (LDD) implantation that is tilted at the first angle. The first ion implantation performed in act 206 is illustrated in FIGS. 5C and 6A, for example, as a PKT implantation 326 that is inclined at a first angle 328 when viewed from an axis (e.g., the y-axis) that is perpendicular to a surface 330 of the semiconductor body 304. The first dopant utilized in the first ion implantation of act 206 of FIG. 4, for example, is one of an n-type dopant and a p-type dopant. A p-type dopant, for example, can comprise one or more of indium and boron. The n-type dopant, for example, can comprise one or more of phosphorous and arsenic. Alternatively, other p-type or n-type dopants are also contemplated, based on desired performance specifications.

Figure 6B:
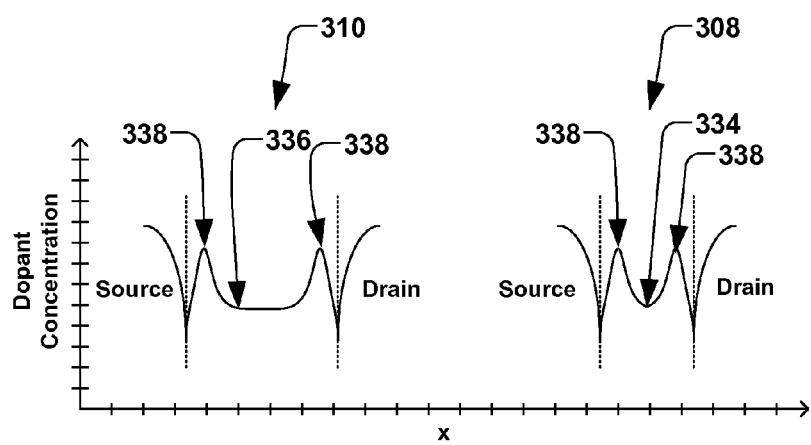

Accordingly, the first ion implantation performed in act 206 implants the desired one of n-type or p-type ions into pocket implant regions 332 illustrated in FIG. 5C that are associated with the plurality of gate structures 306 in both the short channel device regions 308 and long channel device regions 310 of FIG. 6A. For example, FIG. 6B illustrates an exemplary short channel doping concentration profile 334 and long channel doping profile 336 arising from the first ion implantation at the first angle of act 206 of FIG. 4. Accordingly, as illustrated in FIG. 6B, dopant concentration peaks 338 are present in both the short channel device region 308 and long channel device region 310, wherein the dopant concentration peaks exist near the pocket implant regions 332 of FIG. 5C. As stated previously, such dopant concentration peaks 338 of FIG. 6B are advantageous in short channel devices (e.g., associated with gate structures 306 in short channel device regions 308 of FIG. 6A), but can be deleterious in long channel devices (e.g., associated with gate structures 306 in long channel device regions 310).

Figure 5D:
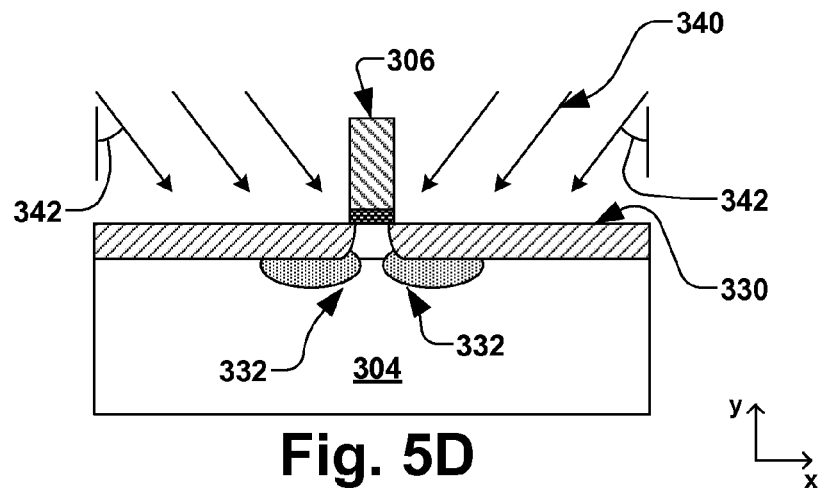
Figure 5E:
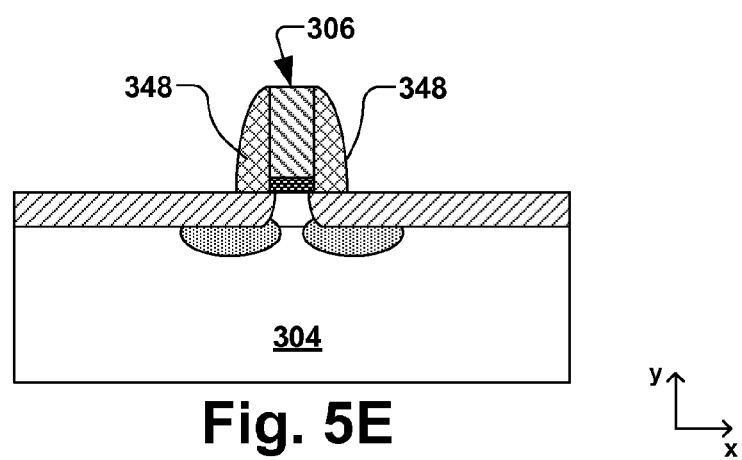

Thus, in accordance with the present embodiment, a second ion implantation is performed utilizing a second dopant at a second angle in act 208 of FIG. 4. The second ion implantation of act 208, for example, can be considered a "counter-pocket" (a "counter-PKT") implantation, wherein the second dopant is one of an n-type dopant and a p-type dopant that is opposite of the first dopant implanted in act 206. For example, if an n-type dopant is implanted in act 206, a p-type dopant is implanted in act 208, and vice-versa. FIG. 5D, for example, illustrates a second ion implantation 340 at a second angle 342 when viewed from the axis (e.g., the y-axis) that is perpendicular to the surface 330 of the semiconductor body 304. As can be seen by comparison, the second angle 342 of FIG. 5D is greater than the first angle 328 of FIG. 5C.

Accordingly, as illustrated in FIG. 7A, the height 320 of the plurality of gate structures 306, in conjunction with the second angle 342 of the second ion implantation 340, generally prevents the second ion implantation from implanting ions into the short channel device region 308, while generally permitting ions to be implanted into the long channel device region 310. Thus, the second ion implantation 340 generally counter-acts the first ion implantation in the pocket implant regions 332 illustrated in FIG. 5D that are associated with the long channel device regions 310 of FIG. 7A, while leaving the pocket implant regions associated with the short channel device regions 308 generally unaffected. Shadowing effects associated with the height 320 of the plurality of gate structures 306 and second angle 342 of FIG. 7A thus generally prevent the second ion implantation 340 from implanting ions into the short channel device region 308.

Figure 7B:
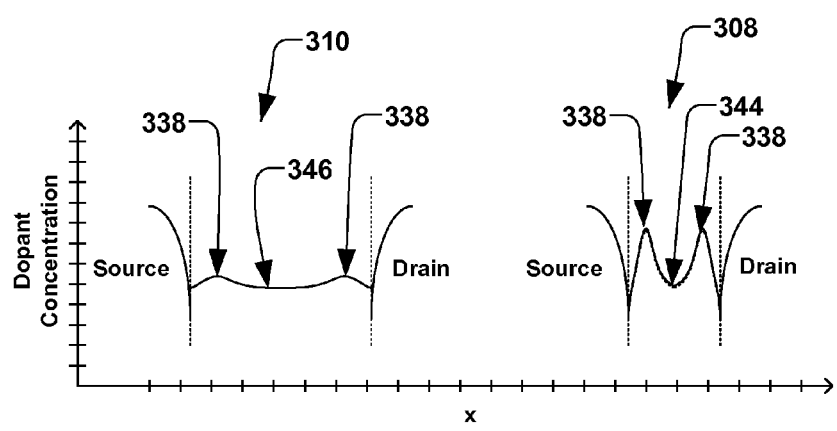

Accordingly, FIG. 7B illustrates an exemplary final short channel doping concentration profile 344 remaining substantially similar to the short channel doping concentration profile 334 of FIG. 6B after the second ion implantation performed in act 208 of FIG. 4. As such, the second ion implantation 340 of FIGS. 5D and 7A at the second angle 342 does not generally alter the short channel doping concentration profile 334 of FIG. 6B due to the above-mentioned shadowing effects. However, the second ion implantation performed in act 208 of FIG. 4 advantageously lowers the dopant concentration peaks 338 of FIG. 6B in the long channel device region 310, as seen in a final long channel doping profile 346 of FIG. 7B. Thus, the second ion implantation performed in act 208 of FIG. 4, for example, generally increases one or more of an analog gain, an output conductance, and a drain-induced barrier lowering associated with the long channel device region 310 of FIGS. 7A-7B, while not substantially affecting the electrical characteristics associated with the short channel device region 308.

Referring again to FIG. 4, in act 210, source and drain regions are formed in the semiconductor body. For example, spacers 348 are further illustrated in FIG. 5E, wherein the spacers may be formed by depositing and patterning a dielectric layer (not shown). In some embodiments, the spacers 348 include a silicon nitride layer on a silicon dioxide layer. In alternative embodiments, the spacers 348 include one or more layers of suitable materials. Suitable materials can include, for example, silicon dioxide, silicon nitride, silicon oxynitride (SiON). The spacer material can be deposited using any suitable technique. Suitable techniques may include, for example, plasma enhanced chemical vapor deposition (PECVD), low-pressure chemical vapor deposition (LPCVD), sub-atmospheric chemical vapor deposition (SACVD), and the like. The spacers 348 can be patterned by any suitable process, for example, an anisotropic etch.

Figure 5F:
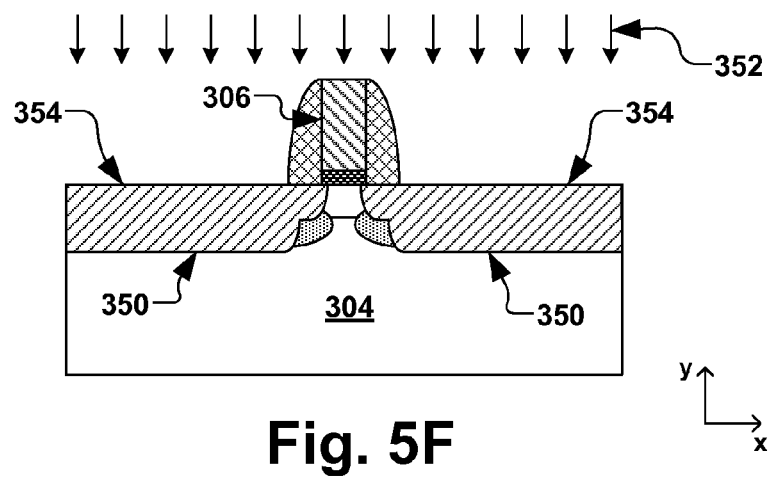

As illustrated in FIG. 5F, source and drain regions 350 are formed by a source/drain ion implantation 352 directed toward the semiconductor body 304. The source and drain regions 350, for example, can also be formed by epitaxial growth. Furthermore, a thermal anneal can be further performed to form contacts 354, as will be understood by one of ordinary skill.

Accordingly, a method for forming a semiconductor device is provided wherein a gate oxide layer is formed on a semiconductor workpiece, and a plurality of gate structures are formed over the gate oxide layer. The plurality of gate structures extend a predetermined height from the gate oxide layer and generally define a short channel device region and a long channel device region.

A first ion implantation is performed with a first dopant at a first angle when viewed from an axis perpendicular to a surface of the semiconductor workpiece, wherein the first dopant is one of an n-type dopant and a p-type dopant. A second ion implantation is further performed with a second dopant at a second angle when viewed from the axis perpendicular to the surface of the semiconductor workpiece. The second angle is greater than the first angle, and the second dopant is one of an n-type dopant and a p-type dopant that is opposite of the first dopant. Accordingly, wherein the height of the plurality of gate structures and the second angle generally prevents the second ion implantation from implanting ions into the short channel device region while generally permitting the second ion implantation to implant ions into the long channel device region.

Further, another method for forming a semiconductor device comprises forming a gate oxide layer on a semiconductor workpiece and forming a plurality of gate structures over the gate oxide layer. The plurality of gate structures extend a predetermined height from the gate oxide layer, and a short channel device region is defined by a plurality of short channel gate structures, and a long channel device region is defined by a plurality of long channel device structures. A first gate length and first spacing between the plurality of short channel gate structures is less than a second gate length and second spacing between the plurality of long channel devices.

A first ion implantation is performed with a first dopant at a first angle when viewed from an axis perpendicular to a surface of the semiconductor workpiece, wherein the first dopant is one of an n-type dopant and a p-type dopant. A second ion implantation is also performed with a second dopant at a second angle when viewed from the axis perpendicular to the surface of the semiconductor workpiece. The second angle is greater than the first angle, and the second dopant is one of an n-type dopant and a p-type dopant that is opposite of the first dopant. Accordingly, the height of the plurality of gate structures and the second angle generally prevents the second ion implantation from implanting ions into the short channel device region while generally permitting the second ion implantation to implant ions into the long channel device region.

Still another method for forming a semiconductor device is provided wherein a gate oxide layer is formed on a semiconductor workpiece and a plurality of gate structures are formed over the gate oxide layer. The plurality of gate structures extend a predetermined height from the gate oxide layer, wherein a long channel device region is generally defined by a long channel gate length and a long channel spacing between a first pair of the plurality of gate structures. A short channel device region is further generally defined by a short channel gate length and short channel spacing between a second pair of the plurality of gate structures.

A pocket ion implantation is performed with a first dopant at a first angle when viewed from an axis perpendicular to a surface of the semiconductor workpiece, wherein the first dopant is one of an n-type dopant and a p-type dopant. A counter-pocket ion implantation is further performed with a second dopant at a second angle when viewed from the axis perpendicular to the surface of the semiconductor workpiece. The second angle is greater than the first angle, and the second dopant is one of an n-type dopant and a p-type dopant that is opposite of the first dopant. The height of the plurality of gate structures and the second angle generally thus prevents the counter-pocket ion implantation from implanting ions into the short channel device region while generally permitting the counter-pocket ion implantation to implant ions into the long channel device region.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for forming a semiconductor device, the method comprising:
    forming a gate oxide layer on a semiconductor workpiece;
    forming a plurality of gate structures over the gate oxide layer, wherein the plurality of gate structures extend a predetermined height from the gate oxide layer and generally define a short channel device region and a long channel device region;
    performing a first ion implantation with a first dopant at a first angle when viewed from an axis perpendicular to a surface of the semiconductor workpiece, wherein the first dopant is one of an n-type dopant and a p-type dopant; and
    performing a second ion implantation with a second dopant at a second angle when viewed from the axis perpendicular to the surface of the semiconductor workpiece, wherein the second angle is greater than the first angle, wherein the second dopant is one of an n-type dopant and a p-type dopant that is opposite of the first dopant, and wherein the plurality of gate structures and the second angle generally prevent the second ion implantation from implanting ions into the short channel device region while generally permitting the second ion implantation to implant ions into the long channel device region.

2. The method of claim 1, wherein shadowing effects associated with the predetermined height of the plurality of gate structures and the second angle generally prevent the second ion implantation from implanting ions into the short channel device region.

3. The method of claim 2, wherein the long channel device region is generally defined by a long channel gate length and a long channel spacing between a first pair of the plurality of gate structures, and wherein the short channel device region is generally defined by a short channel gate length and a short channel spacing between a second pair of the plurality of gate structures.

4. The method of claim 1, wherein the p-type dopant comprises one or more of indium and boron.

5. The method of claim 1, wherein the n-type dopant comprises one or more of phosphorous and arsenic.

6. The method of claim 1, wherein the first ion implantation comprises one of a lightly doped drain implant and a pocket implant.

7. The method of claim 1, further comprising:
    forming spacers around the plurality of gate structures;
    forming source/drain regions; and
    forming contacts on the plurality of gate structures.

8. The method of claim 1, wherein the second ion implantation does not generally alter a doping profile within the short channel device region.

9. The method of claim 8, wherein the second ion implantation generally flattens a doping profile within the long channel device region.

10. The method of claim 9, wherein the second ion implantation generally increases one or more of an analog gain, an output conductance, and a drain-induced barrier lowering associated with the long channel device region.

11. The method of claim 1, wherein forming the plurality of gate structures over the gate oxide layer comprises:
    forming a polysilicon layer over the gate oxide layer;
    patterning a photoresist layer over the polysilicon layer, wherein the patterned photoresist layer covers portions of the polysilicon layer; and
    removing portions of the polysilicon layer and gate oxide layer that are not covered by the patterned photoresist layer.

12. A method for forming a semiconductor device, the method comprising:
    forming a gate oxide layer on a semiconductor workpiece;
    forming a plurality of gate structures over the gate oxide layer, wherein the plurality of gate structures extend a predetermined height from the gate oxide layer, and wherein a short channel device region is defined by a plurality of short channel gate structures, wherein a long channel device region is defined by a plurality of long channel device structures, wherein a first gate length and a first spacing between the plurality of short channel gate structures are respectively less than a second gate length and a second spacing between the plurality of long channel devices;
    performing a first ion implantation with a first dopant at a first angle when viewed from an axis perpendicular to a surface of the semiconductor workpiece, wherein the first dopant is one of an n-type dopant and a p-type dopant; and
    performing a second ion implantation with a second dopant at a second angle when viewed from the axis perpendicular to the surface of the semiconductor workpiece, wherein the second angle is greater than the first angle, wherein the second dopant is one of an n-type dopant and a p-type dopant that is opposite of the first dopant, and wherein the predetermined height of the plurality of gate structures and the second angle generally prevent the second ion implantation from implanting ions into the short channel device region while generally permitting the second ion implantation to implant ions into the long channel device region.

13. The method of claim 12, wherein shadowing effects associated with the predetermined height of the plurality of gate structures and the second angle generally prevent the second ion implantation from implanting ions into the short channel device region.

14. The method of claim 12, wherein the p-type dopant comprises one or more of indium and boron.

15. The method of claim 12, wherein the n-type dopant comprises one or more of phosphorous and arsenic.

16. The method of claim 12, wherein one or more of the first ion implantation and the second ion implantation comprises one of a lightly doped drain implant and a pocket implant.

17. The method of claim 12, wherein the second ion implantation does not generally alter a doping profile within the short channel device region.

18. The method of claim 17, wherein the second ion implantation generally flattens a doping profile within the long channel device region.

19. A method for forming a semiconductor device, the method comprising:
    forming a gate oxide layer on a semiconductor workpiece;
    forming a plurality of gate structures over the gate oxide layer, wherein the plurality of gate structures extend a predetermined height from the gate oxide layer, wherein a long channel device region is generally defined by a long channel gate length and a long channel spacing between a first pair of the plurality of gate structures, and wherein a short channel device region is generally defined by a short channel gate length and a short channel spacing between a second pair of the plurality of gate structures;
    performing a pocket ion implantation with a first dopant at a first angle when viewed from an axis perpendicular to a surface of the semiconductor workpiece, wherein the first dopant is one of an n-type dopant and a p-type dopant; and
    performing a counter-pocket ion implantation with a second dopant at a second angle when viewed from the axis perpendicular to the surface of the semiconductor workpiece, wherein the second angle is greater than the first angle, wherein the second dopant is one of an n-type dopant and a p-type dopant that is opposite of the first dopant, and wherein the predetermined height of the plurality of gate structures and the second angle generally prevents the counter-pocket ion implantation from implanting ions into the short channel device region while generally permitting the counter-pocket ion implantation to implant ions into the long channel device region.

20. The method of claim 19, wherein shadowing effects associated with the predetermined height of the plurality of gate structures and the second angle generally prevent the counter-pocket ion implantation from implanting ions into the short channel device region.

* * * * *